US011367775B1

(12) United States Patent
Hell et al.

(10) Patent No.: US 11,367,775 B1
(45) Date of Patent: Jun. 21, 2022

(54) SHIELDING STRUCTURE FOR SIC DEVICES

(71) Applicant: Infineon Technologies AG, Neubiberg (DE)

(72) Inventors: Michael Hell, Erlangen (DE); Rudolf Elpelt, Erlangen (DE); Caspar Leendertz, Munich (DE)

(73) Assignee: Infineon Technologies AG, Neubiberg (DE)

( * ) Notice: Subject to any disclaimer, the term of this patent is extended or adjusted under 35 U.S.C. 154(b) by 2 days.

(21) Appl. No.: 17/128,745

(22) Filed: Dec. 21, 2020

(51) Int. Cl.
*H01L 29/06* (2006.01)
*H01L 29/16* (2006.01)
*H01L 29/78* (2006.01)
*H01L 21/265* (2006.01)
*H01L 29/66* (2006.01)
*H01L 29/47* (2006.01)

(52) U.S. Cl.
CPC .... *H01L 29/0626* (2013.01); *H01L 21/26513* (2013.01); *H01L 29/0634* (2013.01); *H01L 29/1608* (2013.01); *H01L 29/47* (2013.01); *H01L 29/66068* (2013.01); *H01L 29/7813* (2013.01)

(58) Field of Classification Search
CPC . H01L 29/06; H01L 29/0626; H01L 29/0634; H01L 29/16; H01L 29/1608; H01L 29/47; H01L 29/66; H01L 29/66068; H01L 29/78; H01L 29/7802; H01L 29/7813; H01L 21/26; H01L 21/265; H01L 21/26513

USPC .......................................................... 257/77
See application file for complete search history.

(56) References Cited

U.S. PATENT DOCUMENTS

| | | | |
|---|---|---|---|
| 2015/0155355 A1* | 6/2015 | Losee | H01L 29/4236 257/77 |
| 2017/0338313 A1* | 11/2017 | Bolotnikov | H01L 29/66068 |
| 2019/0172910 A1* | 6/2019 | Siemieniec | H01L 29/4236 |
| 2019/0296110 A1* | 9/2019 | Meiser | H01L 29/7397 |
| 2020/0111874 A1* | 4/2020 | Meiser | H01L 29/407 |
| 2021/0050421 A1* | 2/2021 | Leendertz | H01L 29/0623 |
| 2021/0091184 A1* | 3/2021 | Hell | H01L 21/046 |

* cited by examiner

*Primary Examiner* — Fazli Erdem
(74) *Attorney, Agent, or Firm* — Murphy, Bilak & Homiller, PLLC

(57) ABSTRACT

A semiconductor device includes: a SiC substrate; a device structure in or on the SiC substrate and subject to an electric field during operation of the semiconductor device; a current-conduction region of a first conductivity type in the SiC substrate below and adjoining the device structure; and a shielding region of a second conductivity type laterally adjacent to the current-conduction region and configured to at least partly shield the device structure from the electric field. The shielding region has a higher net doping concentration than the current-conduction region, and has a length (L) measured from a first position which corresponds to a bottom of the device structure to a second position which corresponds to a bottom of the shielding region. The current-conduction region has a width (d) measured between opposing lateral sides of the current-conduction region, and L/d is in a range of 1 to 10.

21 Claims, 5 Drawing Sheets

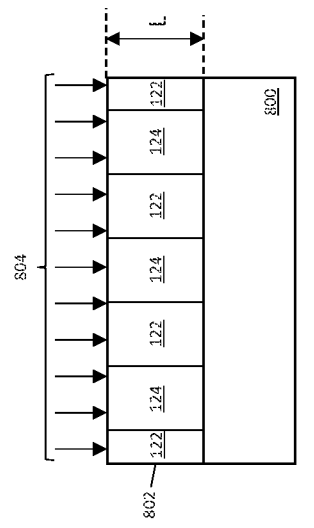
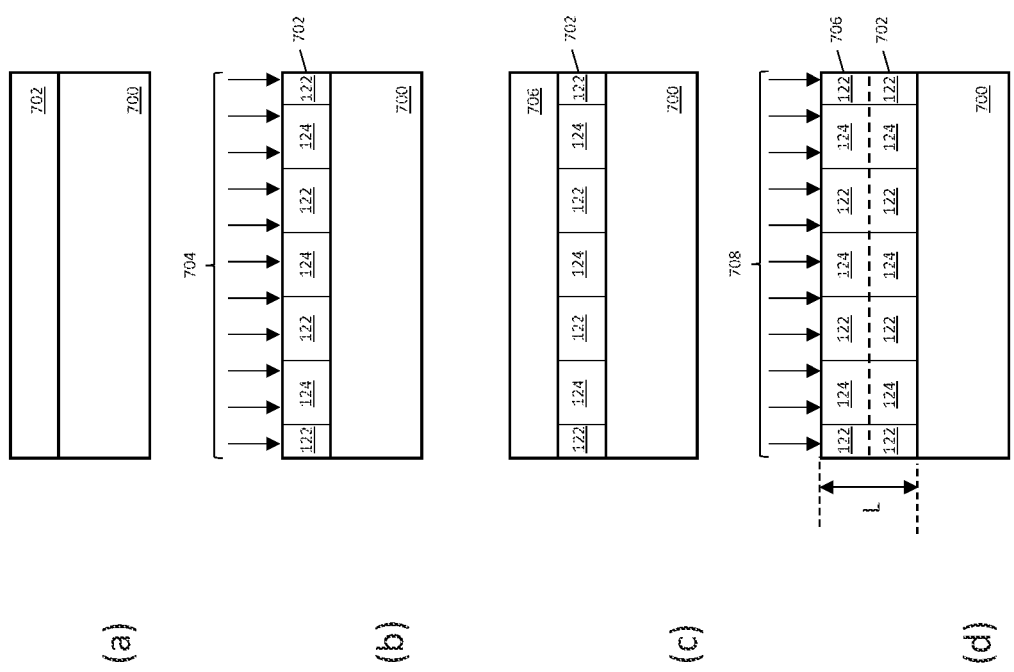
Figure 8
Figure 7

SHIELDING STRUCTURE FOR SIC DEVICES

BACKGROUND

SiC (silicon carbide) power devices provide a reduced drift-zone resistance compared to Si power devices since SiC power devices can tolerate larger electrical fields before breakdown occurs. Due to these larger electric fields, proper shielding of the gate oxide of SiC power MOSFETs (metal-oxide-semiconductor field-effect transistors) is a limiting factor in achieving long-term reliability. In principle, shielding is needed for planar-gate devices and is especially critical for trench-gate devices. A trench gate reaches deeper into the SiC substrate and has rounded corners which leads to enhanced field crowding.

Gate oxide shielding for n-channel SiC power devices is typically implemented by a p-type buried implant. However, implantation energy limitations for aluminum (p-type dopant) at large doses result in a very limited depth of about only 500 nm (nanometer) below the gate trench bottom for the p-type shielding regions. Between neighboring p-type shielding regions is an n-type region through which current flows when the SiC device is on. This n-type region has a typical width of at least 1 μm (micrometer) or larger. Accordingly, the electric field at the gate oxide depends sensitively on the gate trench depth, the width of the n-type region between neighboring p-type shielding regions, and the drain potential.

This problem is exacerbated for dual-channel designs which use both gate trench sidewalls as channel regions. Dual-channel designs require an increased width of the n-type region between neighboring p-type shielding regions. However, to ensure proper shielding, the lateral distance between the edge of the p-type shielding regions and each trench sidewall must be reduced as compared to a one-sided channel design. This leads to an additional challenge of keeping the threshold voltage of the SiC MOSFET stable, since there is a p-implantation tail at the edge of the mask blocking out the p-dopant implant in the n-type region during the implantation. This tail reaches from the lateral edge of the p-dopant implant up to the surface of the SiC substrate. The tail may come close to the trench sidewalls and renders the channel doping sensitive to the trench width and width of the n-type region between neighboring p-type shielding regions. Ensuring that this tail is kept away from the trench sidewalls is a major technological challenge for the realization of dual-channel designs.

Another way to shield the gate oxide for a trench design with a two-sided channel is a p-type implant below the trench. However, in this case the p-type implant must be connected to the source contact, which requires an interruption of the channel region in the direction along the trench. This increases the RonA (ON-resistance per unit area) and such three-dimensional designs make the structure more complicated to fabricate.

Thus, there is a need for an improved shielding structure for SiC devices.

SUMMARY

According to an embodiment of a semiconductor device, the semiconductor device comprises: a SiC substrate; a device structure in or on the SiC substrate and subject to an electric field during operation of the semiconductor device; a current-conduction region of a first conductivity type in the SiC substrate below and adjoining the device structure; and a shielding region of a second conductivity type laterally adjacent to the current-conduction region and configured to at least partly shield the device structure from the electric field, wherein the shielding region has a higher net doping concentration than the current-conduction region, wherein the shielding region has a length (L) measured from a first position which corresponds to a bottom of the device structure to a second position which corresponds to a bottom of the shielding region, wherein the current-conduction region has a width (d) measured between opposing lateral sides of the current-conduction region, wherein L/d is in a range of 1 to 10.

According to an embodiment of a method of producing a semiconductor device, the method comprises: forming a device structure in or on the SiC substrate, the device structure subject to an electric field during operation of the semiconductor device; forming a current-conduction region of a first conductivity type in the SiC substrate below and adjoining the device structure; and forming a shielding region of a second conductivity type laterally adjacent to the current-conduction region, the shielding region configured to at least partly shield the device structure from the electric field, wherein the current-conduction region and the shielding region are formed such that: the shielding region has a higher net doping concentration than the current-conduction region; the shielding region has a length (L) measured from a first position which corresponds to a bottom of the device structure to a second position which corresponds to a bottom of the shielding region; the current-conduction region has a width (d) measured between opposing lateral sides of the current-conduction region; and L/d is in a range of 1 to 10.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIG. 7 illustrates partial cross-sectional views of an embodiment of a method of producing the shielding structure shown in FIGS. 1 through 6.

FIG. 8 illustrates partial cross-sectional views of another embodiment of a method of producing the shielding structure shown in FIGS. 1 through 6.

DETAILED DESCRIPTION

Described herein is an improved shielding structure for SiC devices. SiC devices that incorporate the shielding structure may be planar gate or trench gate transistors, or diodes such as Schottky diodes. In the case of a trench gate SiC device, a channel region may be provided along one or both sidewalls of the gate trenches. In some cases, the SiC device may have a superjunction (SJ) structure that includes alternating regions of n-type and p-type semiconductor material formed in the SiC substrate. The superjunction structure enables the device to block its full voltage by balancing additional charge in the drift zone (e.g. n-charge for an n-channel device) by adjacently positioned regions of the opposite conductivity type (e.g. p-type for an n-channel device), allowing for at least two degrees of freedom in setting the on-state resistance and blocking voltage of the device. For each type of SiC device, deeper implants are used to form the shielding structure with dimensions that improve the targeted shielding, e.g., gate oxide shielding.

Described next in more detail are various embodiments of the shielding structure for various types of SiC devices. While the shielding structure is described in the context of SiC as the base semiconductor material, other types of wide-bandgap semiconductors may be used instead of SiC. The term 'wide-bandgap semiconductor' as used herein refers to any semiconductor material having a bandgap greater than 1.5 eV. For example, the term 'wide-bandgap semiconductor' includes SiC and GaN (gallium nitride). Still other wide-bandgap semiconductor materials may be used. In the following embodiments, the first conductivity is n-type and the second conductivity type is p-type for an n-channel device and the first conductivity is p-type and the second conductivity type is n-type for a p-channel device.

Figure 1:
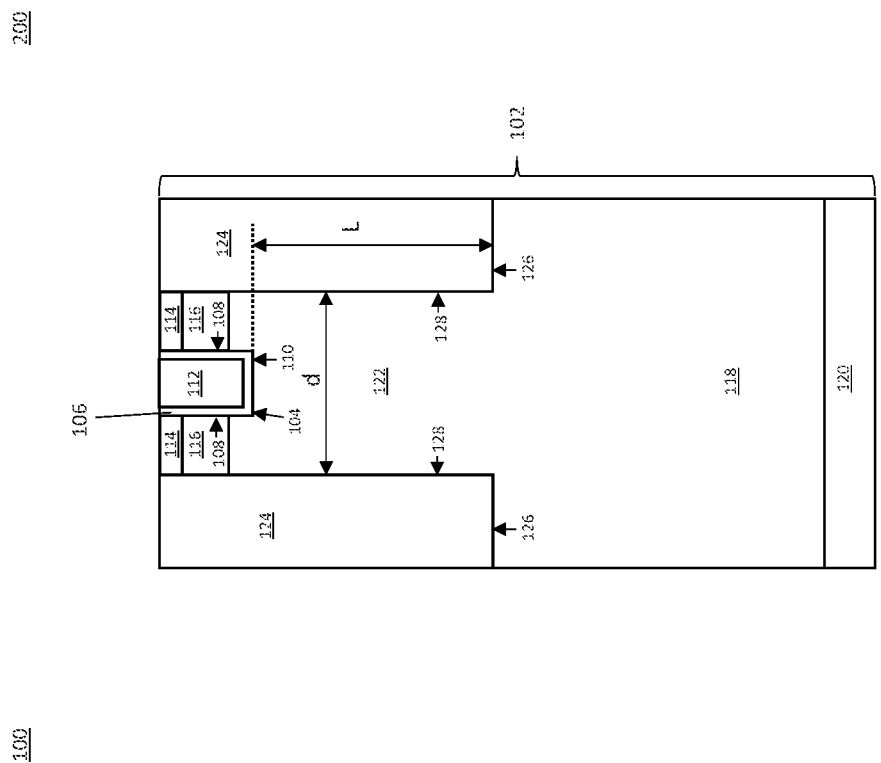

FIG. 1 illustrates a partial cross-sectional view of an embodiment of a semiconductor device 100 that includes a SiC substrate 102. The SiC substrate 102 may include a base semiconductor and one or more epitaxial layers grown on the base semiconductor. A device structure formed in or on the SiC substrate 102 is subject to an electric field during operation of the semiconductor device 100. According to the embodiment illustrated in FIG. 1, the device structure is a trench transistor gate structure formed in the SiC substrate 102.

The trench transistor gate structure includes a gate trench 104 formed in the SiC substrate 102, e.g., by etching, a gate dielectric 106 lining the sidewalls 108 and bottom 110 of the gate trench 104, and a gate electrode 112 separated from the SiC substrate 102 by the gate dielectric 106. According to the embodiment illustrated in FIG. 1, the semiconductor device 100 is a trench gate transistor and the trench transistor gate structure is part of a transistor cell. The semiconductor device 100 may include 10s, 100s, 1000s or even more of these transistor cells to form a power MOSFET. Each transistor cell also includes a source region 114 of a first conductivity type and a body region 116 of a second conductivity type opposite the first conductivity type disposed along the sidewalls 108 of the gate trench 104. The body region 116 separates the source region 114 from a drift zone 118 of the first conductivity type. A drain region 120 of the first conductivity type adjoins the drift zone 118 at the opposite side of the SiC substrate 102 as the source region 114. Further according to the embodiment illustrated in FIG. 1, a channel region forms in the body region 116 along both sidewalls 108 of the gate trench 104 when an appropriate voltage is applied to the gate electrode 112.

The semiconductor device 100 also includes a current-conduction region 122 of the first conductivity type in the SiC substrate 102 below and adjoining the device structure. According to the embodiment illustrated in FIG. 1, the current-conduction region 122 adjoins the bottom 110 of the gate trench 104 and is a JFET (junction field-effect transistor) region.

The semiconductor device 100 also includes a shielding region 124 of the second conductivity type. The shielding region 124 is laterally adjacent to the current-conduction region 122 and configured to at least partly shield the device structure from an electric field during operation of the semiconductor device 100. According to the embodiment illustrated in FIG. 1, the shielding region 124 is configured to at least partly shield the gate dielectric 106 in the gate trench 104 from an electric field during operation of the semiconductor device 100. The gate trench 104 may have rounded corners which leads to enhanced field crowding, and the shielding region 124 limits the electric field in this region of the trench transistor gate structure.

The shielding region 124 has a higher net (total) doping concentration than the current-conduction region 122 such that as the semiconductor device 100 is depleted by applying a positive voltage to the drain region 120, the current-conduction region 122 is depleted but not the shielding region 124 in the lateral (horizontal) direction. Also, the shielding region 124 has a length (L) measured from a first position which corresponds to a bottom of the device structure to a second position which corresponds to a bottom 126 of the shielding region 124. According to the embodiment illustrated in FIG. 1, the first position from which the length of the shielding region 124 is measured corresponds to the bottom 110 of the gate trench 104. The current-conduction region 122 has a width (d) measured between opposing lateral sides 128 of the current-conduction region 122. The ratio L/d is in a range of 1 to 10, to ensure effective shielding by the shielding region 124. In one embodiment, the ratio L/d is 5 or less.

Effective shielding in FIG. 1 means that the shielding region 124 ensures that the magnitude of the electric field that penetrates the gate dielectric 106 during operation of the semiconductor device 100 does not exceed a critical magnitude of the electric field of the gate dielectric 106, thus avoiding breakdown of the gate dielectric 106 over the lifetime of the semiconductor device 100. If L/d is too low (e.g., <1), the shielding of the gate dielectric 106 against the drain potential is less effective and dielectric breakdown may occur. If L/d too large (e.g., >10), the current-conduction region 122 is widened and thus RonA is increased without further improvement of the gate oxide shielding. However, if a low saturation current is desired, L/d may fall outside the range of 1 to 10.

The L/d design rule described herein applies independent of the precise design of the top part of the device cell, such as a single-sided channel, a two-sided channel, or modifications in the drift zone 118 such as by including a superjunction structure. Planar gate device structures also may profit from the L/d design criteria. However, a too strong reduction of the gate-to-drain capacitance ($C_{GD}$) may lead to difficulties in controlling the switching behavior of the transistor device. In this case, the net doping concentration $N_{sh}$ of the shielding region 124 may be reduced and/or the length 1' of the current-conduction region 122 may be reduced to tune $C_{GD}$ to gain proper control of the device.

If limited by L, the width 'd' of the current-conduction region 122 may be made as small as possible to ensure L/d is in a range of 1 to 10. If L can be larger, d may be made larger which in turn reduces/avoids the implantation tail issue previously described herein. If the shielding region 124 and the current-conduction region 122 are formed using more than one epitaxial layer, the implantation tail issue also may be avoided by growing the epi to the bottom 108 of the gate trench 104 which should avoid the tail near the gate dielectric 106, particularly at the sidewall 108.

The shielding effectiveness provided by the shielding region 124 may be defined in several ways. For example, dopants of the second conductivity type may be implanted into the shielding region 124 such that $N_{sh}/N_{dev}$ is in a range of 1.5 to 100, where $N_{sh}$ is the net doping concentration of the shielding region 124 and $N_{dev}$ is the net doping concentration of the current-conduction region 122. With $1.5 \leq N_{sh}/N_{dev} \leq 100$, and during application of a positive voltage to the drain region 120, the current-conduction region 122 is depleted in the lateral direction but not the shielding region 124. In one embodiment, $N_{sh}/N_{dev}$ may be in a range of 3 to 30.

In another example, dopants of the second conductivity type may be implanted into the shielding region 124 such that the net doping concentration ($N_{sh}$) of the shielding region 124 is greater than $N_{crit}$, where $N_{crit}=E_{crit}\cdot\varepsilon_0\varepsilon_r/(e\cdot L)$, $E_{crit}$ is a critical electrical field for avalanche breakdown of the SiC substrate, $\varepsilon_0$ is vacuum permittivity, $\varepsilon_r$ is a dielectric constant and e is electron charge. With $N_{sh}>N_{crit}$, and as voltage is applied to the drain region 120, the shielding region 124 is not depleted from below in the vertical direction. In one embodiment, $N_{sh}/N_{crit}$ is in a range of 1.5 to 100.

Figure 2:
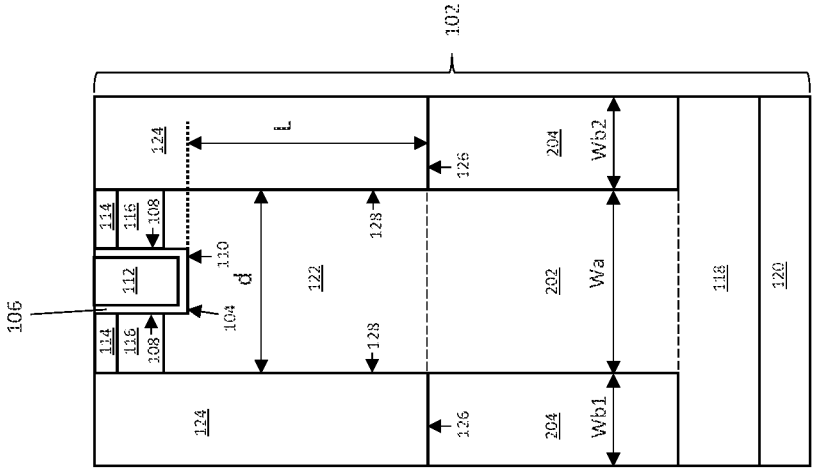
FIGS. 1 through 6 illustrate respective partial cross-sectional views of different embodiments of semiconductor devices having a shielding structure.

FIG. 2 illustrates a partial cross-sectional view of another embodiment of a semiconductor device 200 having the shielding region 124. The embodiment shown in FIG. 2 is similar to the embodiment shown in FIG. 1. Different, however, the semiconductor device 200 of FIG. 2 further includes a superjunction (SJ) structure.

The superjunction structure includes a first region 202 of the first conductivity type below and adjoining the current-conduction region 122, and a second region 204 of the second conductivity type below and adjoining the shielding region 124. The first SJ region 202 of the first conductivity is delineated by horizontal lines in FIG. 2 to indicate the position of the first SJ region 202 relative to the current-conduction region 122, the drift zone 118 and the second SJ region 204 of the second conductivity type. However, the first SJ region 202 may be integrally formed with the current-conduction region 122 and the drift zone 118 of the same conductivity type, but may have a different doping concentration than the current-conduction region 122 and/or the drift zone 118.

Charge balance is provided between the oppositely doped semiconductor regions 202, 204 of the superjunction structure to allow for a lower resistance (higher doping) of the drift zone 118 and thus lower RonA. For example, the oppositely doped semiconductor regions 202, 204 of the superjunction structure may have an average doping concentration of 1e16/cm3 to 5e17/cm3. Charge balance may be achieved by adjusting the dimensions, shape and/or doping concentrations of the first and second regions 202, 204 of the superjunction structure. More particularly, Na is the doping concentration of the first SJ region 202 of the first conductivity, Wa is the (horizontal) width of the first SJ region 202, Nb is the doping concentration of the second SJ region 204 of the second conductivity, and Wb is the (horizontal) width of the second SJ region 204 where Wb=Wb1+Wb2 in FIG. 2. While the width Wa of the first SJ region 202 is shown in the figures to be equal to the width d of the current-conduction region 122, this need not be the case. Wa may be larger or smaller than d.

In one embodiment, Na*Wa=Δ*Nb*Wb along at least part of the superjunction structure and Δ is in a range of 2/3 to 3/2. The design of the superjunction structure may implement an intentional doping profile of the columns 202, 204 in the vertical direction. For example, the doping in the upper part of the second SJ regions 204 may be larger than in the lower part of the second SJ regions 204. Accordingly, for each horizontal cross-section taken through the superjunction structure in a direction parallel to the front main surface of the SiC substrate 102, Na*Wa=Δ*Nb*Wb but Na, Wa, Nb and/or Wb may vary vertically in a direction perpendicular to the front main surface of the SiC substrate 102.

Charge balance may be achieved by adjusting the dimensions, shape and/or doping concentrations of the first and second regions 202, 204 of the superjunction structure. The SJ pillar design may be symmetric or asymmetric, with the doping concentrations Na, Nb of the first and second SJ regions 202, 204 adjusted accordingly.

Figure 3:
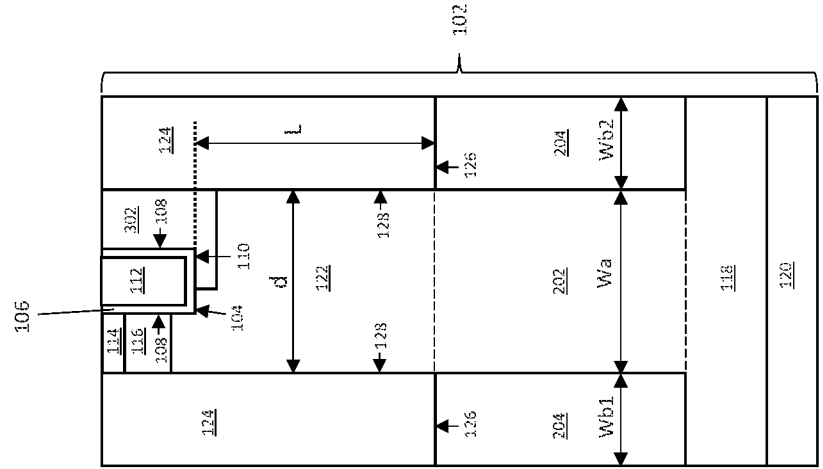

FIG. 3 illustrates a partial cross-sectional view of another embodiment of a semiconductor device 300 having the shielding region 124. The embodiment shown in FIG. 3 is similar to the embodiment shown in FIG. 1. Different, however, the semiconductor device 300 of FIG. 3 has a transistor channel region at only one of the sidewalls 108 of the gate trench 104. An extension 302 of the shielding region 124 occupies the area of the SiC substrate 102 between the other sidewall 108 of the gate trench 104 and the neighboring shielding region 124. The shielding region extension 302 may also laterally extend at least partly under the bottom 110 of the gate trench 104, as shown in FIG. 3. Alternatively, the extension 302 may be omitted and the shielding region 124 may extend under the gate trench 104, keeping at least a part of the shielding region 124 connected to the surface to form a contact.

Figure 4:
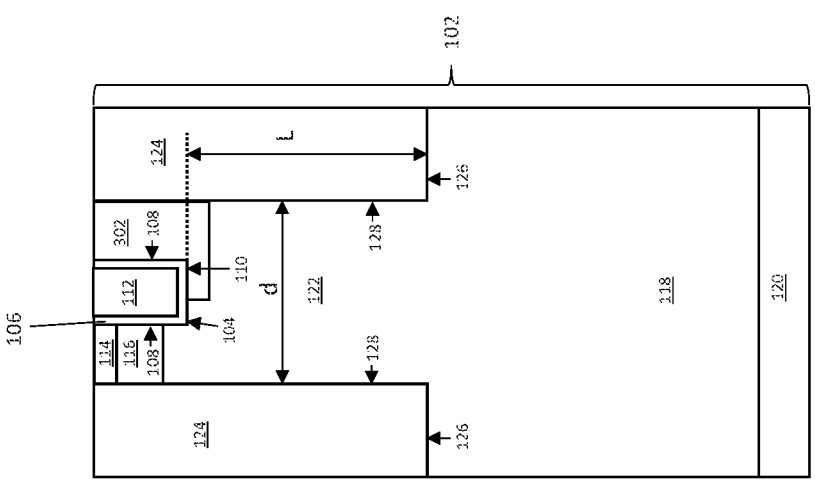

FIG. 4 illustrates a partial cross-sectional view of another embodiment of a semiconductor device 400 having the shielding region 124. The embodiment shown in FIG. 4 represents a combination or merging of the embodiments shown in FIGS. 2 and 3 in that the semiconductor device 400 of FIG. 4 has a superjunction structure, as shown in FIG. 2, and a transistor channel region at only one of the sidewalls 108 of the gate trench 104 with an extension 302 of the shielding region 124 occupying the area of the SiC substrate 102 between the other sidewall 108 of the gate trench 104 and the neighboring shielding region 124, as shown in FIG. 3. The shielding region extension 302 may also laterally extend at least partly under the bottom 110 of the gate trench 104, as explained above.

Figure 5:
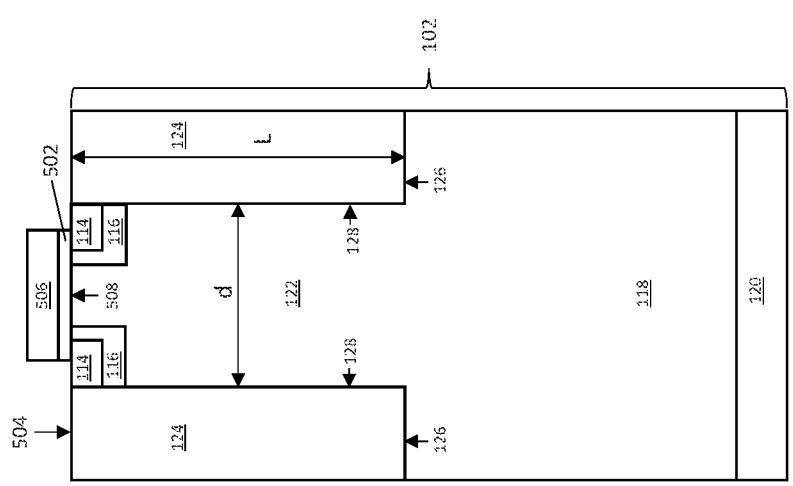

FIG. 5 illustrates a partial cross-sectional view of another embodiment of a semiconductor device 500 having the shielding region 124. The embodiment shown in FIG. 5 is similar to the embodiment shown in FIG. 1. Different, however, the device structure of the semiconductor device 500 of FIG. 5 is a planar transistor gate structure. The planar transistor gate structure includes a gate dielectric 502 formed on a first main surface 504 of the SiC substrate 102 and a gate electrode 504 formed on the gate dielectric 502 and separated from the first main surface 504 of the SiC substrate 102 by the gate dielectric 502. According to the embodiment illustrated in FIG. 5, the current-conduction region 122 adjoins the bottom 508 of the gate dielectric 502 at the interface between the first main surface 504 of the SiC substrate 102 and the gate dielectric 502. Further according to the embodiment illustrated in FIG. 5, the first position from which the length L of the shielding region 124 is measured corresponds to the bottom 508 of the gate dielectric 502. The shielding region 124 may also extend laterally under the body region 116.

Figure 6:
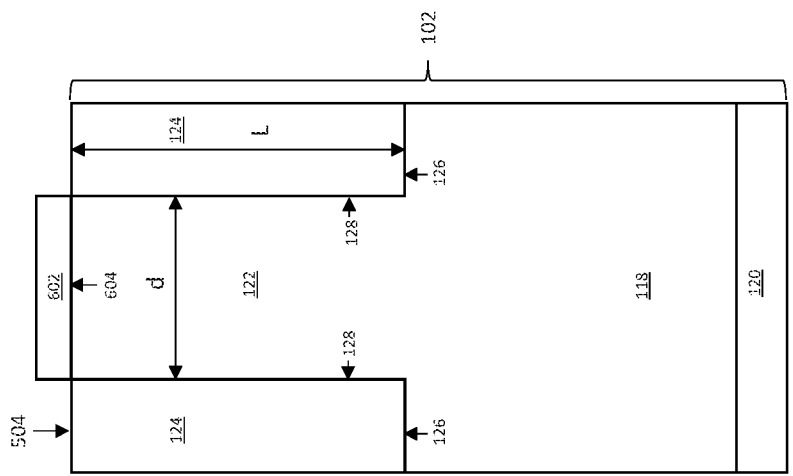

FIG. 6 illustrates a partial cross-sectional view of another embodiment of a semiconductor device 600 having the shielding region 124. According to this embodiment, the semiconductor device 600 illustrated in FIG. 6 is a Schottky diode and the device structure of the semiconductor device 600 is a metal contact 602 formed on the first main surface 504 of the SiC substrate 102. The current-conduction region 122 adjoins the metal contact 602 to form a Schottky junction 604. For example, the metal contact 602 may comprise Pt, Ti, Ni, Cr, Mo, W, WSi, and/or Au. Still other metal and/or metal alloy combinations may be used for the metal contact 602. According to the embodiment illustrated in FIG. 6, the first position from which the length L of the shielding region 124 is measured corresponds to the Schottky junction 604 and the and the shielding provided by the shielding region 124 ensures the electric field at the metal contact 602 does not become excessively large which may lead to tunneling currents across the Schottky junction 604.

Described next are embodiments of forming the shielding region 124. These embodiments may be used to produce the semiconductor devices shown in FIGS. 1 through 6.

FIG. 7 illustrates a first embodiment of forming the shielding region. According to the embodiment illustrated in FIG. 7, the shielding region 124 is formed by growing a plurality of epitaxial layers of the first conductivity type and masked implanting of dopants of the second conductivity type into each of the epitaxial layers in a laterally aligned manner. This embodiment may be beneficial in the case of limited implantation energy. Alternatively, the epitaxial layers may be grown with or without low intentional doping followed by implantation of dopants of one conductivity type (blanket or masked) into the epitaxial layers and then implantation of dopants of the opposite conductivity type into the epitaxial layers.

Step (a) shows a base SiC body 700 and a first epitaxial layer 702 of the first conductivity type grown on the base SiC body 700. Any standard epitaxial process may be used to grow the first epitaxial layer 702 on the base SiC body 700. In one embodiment, the base SiC body 700 is a SiC wafer and a plurality of semiconductor devices each having the shielding region 124 are formed using the SiC wafer.

Step (b) shows a first implantation process 704 during which dopants of the first and second conductivity type are implanted into the first epitaxial layer 702. The dopants of the first conductivity type such as phosphorus, nitrogen, etc. form the current-conduction region 122 and the first SJ region 202 of the optional superjunction structure in the first epitaxial layer 702. The dopants of the second conductivity type such as aluminum or boron form the shielding region 124 and the second SJ region 204 of the optional superjunction structure in the first epitaxial layer 702. The dopants of the second conductivity type may be implanted at energies, e.g., up to about 1.7 MeV, up to 30 MeV, or higher.

Step (c) shows a second epitaxial layer 706 of the first conductivity type grown on the first epitaxial layer 702. Any standard epitaxial process may be used to grow the second epitaxial layer 706 on the first epitaxial layer 702.

Step (d) shows a second implantation process 708 during which dopants of the first and second conductivity type are implanted into the second epitaxial layer 702. The dopants of the first conductivity type extend the current-conduction region 122 and the first SJ region 202 of the optional superjunction structure into the second epitaxial layer 706, respectively, and vertically aligned with the current-conduction region 122 and the first SJ region 202 of the optional superjunction structure in the first epitaxial layer 702. The dopants of the second conductivity type similarly extend the shielding region 124 and the second SJ region 204 of the optional superjunction structure into the second epitaxial layer 706, respectively, and vertically aligned with the shielding region 124 and the second SJ region 204 of the optional superjunction structure in the second epitaxial layer 706. Steps (c) and (d) may be repeated as many times as desired, to yield the desired length l' for the shielding region 124.

Alignment marks may be used to ensure proper lateral alignment of the superjunction structures in the first and second epitaxial layers 702, 706. The alignment marks ensure that the n- and p-segments of different epitaxial layers 702, 706 are not laterally (horizontally) shifted with respect to one another. The p- and n-segments of the successive epitaxial layers 702, 706 are connected to each other by aligning the peaks into the depth of the device, e.g., by controlling the epitaxial layer thickness. However, the shielding region 124 may not be perfectly aligned in the vertical direction over the combined thickness of the epitaxial layers 702, 706. Such misalignment may be intentional, by purposely forming a step between the stacked regions by using an intentional misalignment. In either case (intentional or unintentional misalignment), the resulting step may yield a smaller 'd' (width of the current-conduction region 122) to lower the saturation current.

Additional features of the device are then formed in the upper part of each device cell. For example, in the case of a planar gate transistor device, a gate dielectric may be formed on the uppermost SiC epitaxial layer 706 and a gate electrode may be formed on the gate dielectric, e.g., as previously described herein in connection with FIG. 5. In the case of a trench gate transistor device, a gate trench may be etched in one or more of the SiC epitaxial layers 702, 706, sidewalls and the bottom of the gate trench may be lined with a gate dielectric, and a gate electrode may be formed in the gate trench and separated from the surrounding SiC material by the gate dielectric, e.g., as previously described herein in connection with FIGS. 1 through 4. In the case of a Schottky diode, a metal contact is formed on the uppermost SiC epitaxial layer 706 and the current-conduction region adjoins the metal contact to form a Schottky junction, e.g., as previously described herein in connection with FIG. 6.

FIG. 8 illustrates a second embodiment of forming the shielding region. According to the embodiment illustrated in FIG. 8, the shielding region 124 is formed in a single epitaxial layer of the first conductivity type.

Step (a) shows a base SiC body 800 and a single epitaxial layer 802 of the first conductivity type grown on the base SiC body 800. Any standard epitaxial process may be used to grow the epitaxial layer 802 on the base SiC body 800. In one embodiment, the base SiC body 800 is a SiC wafer and a plurality of semiconductor devices each having the shielding region 124 are formed using the SiC wafer.

Step (b) shows an implantation process 804 during which dopants of the first and second conductivity type are implanted into the single epitaxial layer 802. The dopants of the first conductivity type form the current-conduction region 122 and the first SJ region 202 of the optional superjunction structure in the single epitaxial layer 802. The dopants of the second conductivity type form the shielding region 124 and the second SJ region 204 of the optional superjunction structure in the single epitaxial layer 802. The dopants of the second conductivity type are implanted at energies having multiple peaks or at a continuous energy spectrum. For example, an implantation depth for aluminum of 5 µm requires an energy of about 20 MeV. In one embodiment, the implantation energy for the dopants of the second conductivity type ranges from a few (1, 2, 3, etc.)

MeV to 10s of MeV. The resulting shielding region 124 may be broader (wider) deeper in the device due to lateral straggle of the implanted ions.

Additional features of the device are then formed in the upper part of each device cell. For example, in the case of a planar gate transistor device, a gate dielectric may be formed on the single SiC epitaxial layer 802 a gate electrode may be formed on the gate dielectric, e.g., as previously described herein in connection with FIG. 5. In the case of a trench gate transistor device, a gate trench may be etched in the single SiC epitaxial layer 802, sidewalls and the bottom of the gate trench may be lined with a gate dielectric, and a gate electrode may be formed in the gate trench and separated from the surrounding SiC material by the gate dielectric, e.g., as previously described herein in connection with FIGS. 1 through 4. In the case of a Schottky diode, a metal contact is formed on the single SiC epitaxial layer 802 and the current-conduction region adjoins the metal contact to form a Schottky junction, e.g., as previously described herein in connection with FIG. 6.

In FIGS. 1 through 8, the gate structures are shown as planar or rectangular trenches. In general, the gate electrode may also have a different shape such as a V-shape. In each case, the lower end of a MOSFET device is where the lowest point of the gate dielectric is located.

Furthermore, the current conduction region 122 and the shielding region 124 may be arranged parallel or transverse to the gate trench 104.

Figure 9:
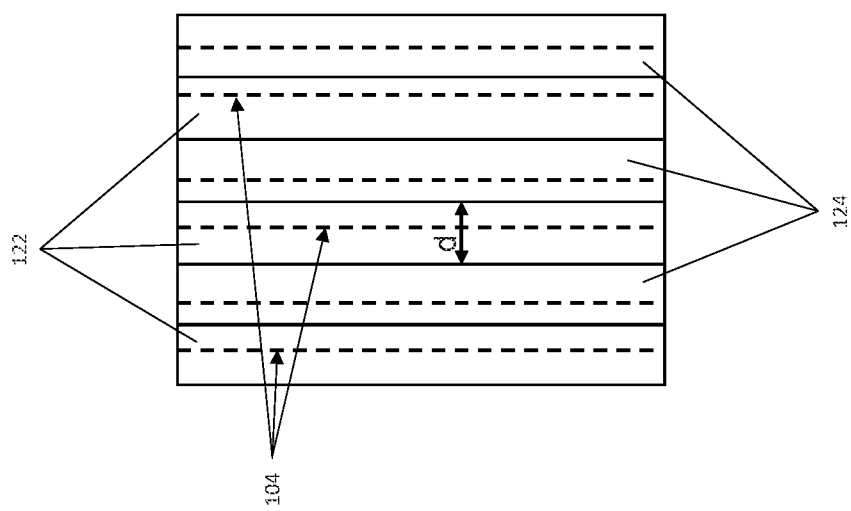
FIG. 9 illustrates a simplified partial top plan view of an embodiment according to which a current conduction region and a shielding region of the device are arranged parallel to the gate trench.

FIG. 9 shows a simplified partial top plan view of an embodiment according to which the current conduction region 122 and the shielding region 124 are arranged parallel to the gate trench 104.

Figure 10:
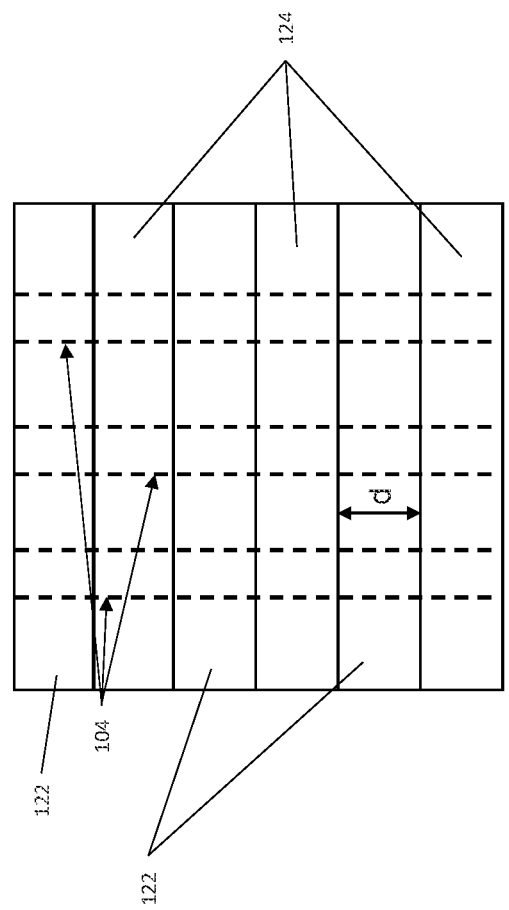
FIG. 10 illustrates a simplified partial top plan view of an embodiment according to which the current conduction region and the shielding region are arranged transverse to the gate trench.

FIG. 10 shows a simplified partial top plan view of an embodiment according to which the current conduction region 122 and the shielding region 124 are arranged transverse to the gate trench 104. This embodiment may be used, e.g., in superjunction devices and in which the pitch of the top cell and the pitch of the superjunction are not the same The shielding region embodiments described herein provide at least the following advantages:

- For the same maximal electric field $E_{gox}$ in the gate dielectric 106 in blocking mode, i.e., for a large source-drain voltage $V_{DS}$, the doping ($N_{dev}$) in the current-conduction region 122 can be larger as compared to conventional devices which reduces RonA.
- The impact of the width 'd' of the current-conduction region 122 on $E_{gox}$ is strongly reduced, which in turn reduces process-induced variations of $E_{gox}$.
- The gate-oxide electric field $E_{gox}$ becomes nearly independent of the applied drain voltage when the current-conduction region 122 is depleted. In this way, the gate-drain capacitance $C_{GD}$ at large voltages $V_{DS}$ can be reduced.
- The minimal achievable $E_{gox}$ with increasing doping ($N_{sh}$) of the shielding region 124 for a given width 'd' of the current-conduction region 122 is lower than what has been conventionally achieved, improving gate-oxide reliability in blocking-mode and possibly allowing for a reduction of the gate dielectric thickness which may result in lower RonA.
- The reduced achievable minimal $E_{gox}$ can alternatively be used to enlarge the current-conduction region 122, which may help to reduce threshold-voltage fluctuations induced by process variations as described above.
- The reduced impact of the drain potential on the channel at large $V_{DS}$ can reduce the drain-induced barrier lowering (DIBL). Furthermore, the DIBL may saturate as a function of $V_{DS}$ once the current-conduction region 122 is depleted. The saturation value can then be tuned by the doping $N_{dev}$ of the current-conduction region 122, gate trench depth, and gate trench width.
- A narrower current-conduction region 122 may help to reduce the saturation current and thus increase short-circuit time. In this case, ratios of L/d>2 or deviating conditions on the doping concentrations may become favorable to achieve low saturation currents.

Although the present disclosure is not so limited, the following numbered examples demonstrate one or more aspects of the disclosure.

Example 1. A semiconductor device, comprising: a SiC substrate; a device structure in or on the SiC substrate and subject to an electric field during operation of the semiconductor device; a current-conduction region of a first conductivity type in the SiC substrate below and adjoining the device structure; and a shielding region of a second conductivity type laterally adjacent to the current-conduction region and configured to at least partly shield the device structure from the electric field, wherein the shielding region has a higher net doping concentration than the current-conduction region, wherein the shielding region has a length (L) measured from a first position which corresponds to a bottom of the device structure to a second position which corresponds to a bottom of the shielding region, wherein the current-conduction region has a width (d) measured between opposing lateral sides of the current-conduction region, wherein L/d is in a range of 1 to 10.

Example 2. The semiconductor device of example 1, wherein L/d is 5 or less.

Example 3. The semiconductor device of example 1 or 2, wherein $N_{sh}/N_{dev}$ is in a range of 1.5 to 100, where $N_{sh}$ is the net doping concentration of the shielding region and $N_{dev}$ is the net doping concentration of the current-conduction region.

Example 4. The semiconductor device of example 3, wherein $N_{sh}/N_{dev}$ is in a range of 3 to 30.

Example 5. The semiconductor device of any of examples 1 through 4, wherein the net doping concentration ($N_{sh}$) of the shielding region is greater than $N_{crit}$, where $N_{crit}=E_{crit}\cdot\varepsilon_0\varepsilon_r/(e\cdot L)$, $E_{crit}$ is a critical electrical field for avalanche breakdown of the SiC substrate, $\varepsilon_0$ is vacuum permittivity, $\varepsilon_r$ is a dielectric constant and e is electron charge.

Example 6. The semiconductor device of example 5, wherein $N_{sh}/N_{crit}$ is in a range of 1.5 to 100.

Example 7. The semiconductor device of any of examples 1 through 6, wherein the device structure comprises a planar transistor gate structure comprising a gate dielectric on a first main surface of the SiC substrate and a gate electrode separated from the first main surface by the gate dielectric, wherein the current-conduction region adjoins a bottom of the gate dielectric at an interface between the first main surface of the SiC substrate and the gate dielectric, and wherein the first position from which the length of the shielding region is measured corresponds to the bottom of the gate dielectric.

Example 8. The semiconductor device of any of examples 1 through 6, wherein the device structure comprises a trench transistor gate structure comprising a gate trench in the SiC substrate, a gate dielectric lining sidewalls and a bottom of the gate trench, and a gate electrode separated from the SiC substrate by the gate dielectric, wherein the current-conduction region adjoins the bottom of the gate trench, and wherein the first position from which the length of the shielding region is measured corresponds to the bottom of the gate trench.

Example 9. The semiconductor device of example 8, further comprising a transistor channel region at both sidewalls of the gate trench.

Example 10. The semiconductor device of any of examples 1 through 6, wherein the device structure comprises a metal contact on a first main surface of the SiC substrate, wherein the current-conduction region adjoins the metal contact to form a Schottky junction, and wherein the first position from which the length of the shielding region is measured corresponds to the Schottky junction.

Example 11. The semiconductor device of any of examples 1 through 10, further comprising a superjunction structure that comprises a first region of the first conductivity type below and adjoining the current-conduction region, and a second region of the second conductivity type below and adjoining the shielding region, wherein Na is a doping concentration of the first region and Wa is a width of the first region, wherein Nb is a doping concentration of the second region and Wb is a width of the second region, wherein Na*Wa=Δ*Nb*Wb in a horizontal cross-section of the superjunction structure, and wherein Δ is in a range of 2/3 to 3/2.

Example 12. A method of producing a semiconductor device, the method comprising: forming a device structure in or on the SiC substrate, the device structure subject to an electric field during operation of the semiconductor device; forming a current-conduction region of a first conductivity type in the SiC substrate below and adjoining the device structure; and forming a shielding region of a second conductivity type laterally adjacent to the current-conduction region, the shielding region configured to at least partly shield the device structure from the electric field, wherein the current-conduction region and the shielding region are formed such that: the shielding region has a higher net doping concentration than the current-conduction region; the shielding region has a length (L) measured from a first position which corresponds to a bottom of the device structure to a second position which corresponds to a bottom of the shielding region; the current-conduction region has a width (d) measured between opposing lateral sides of the current-conduction region; and L/d is in a range of 1 to 10.

Example 13. The method of example 12, wherein forming the device structure comprises: forming a gate dielectric on a first main surface of the SiC substrate; and forming a gate electrode on the gate dielectric, wherein the current-conduction region adjoins a bottom of the gate dielectric at an interface between the first main surface of the SiC substrate and the gate dielectric, wherein the first position from which the length of the shielding region is measured corresponds to the bottom of the gate dielectric.

Example 14. The method of example 12, wherein forming the device structure comprises: etching a gate trench in the SiC substrate; lining sidewalls and a bottom of the gate trench with a gate dielectric; and forming a gate electrode in the gate trench and separated from the SiC substrate by the gate dielectric, wherein the current-conduction region adjoins the bottom of the gate trench, wherein the first position from which the length of the shielding region is measured corresponds to the bottom of the gate trench.

Example 15. The method of any of examples 12 through 14, wherein forming the device structure comprises: forming a metal contact on a first main surface of the SiC substrate, wherein the current-conduction region adjoins the metal contact to form a Schottky junction, wherein the first position from which the length of the shielding region is measured corresponds to the Schottky junction.

Example 16. The method of any of examples 12 through 15, further comprising:
forming a superjunction structure that comprises a first region of the first conductivity type below and adjoining the current-conduction region, and a second region of the second conductivity type below and adjoining the shielding region, wherein Na is a doping concentration of the first region and Wa is a width of the first region, wherein Nb is a doping concentration of the second region and Wb is a width of the second region, wherein Na*Wa=Δ*Nb*Wb in a horizontal cross-section of the superjunction structure, and wherein Δ is in a range of 2/3 to 3/2.

Example 17. The method of any of examples 12 through 16, wherein forming the shielding region comprises: implanting dopants of the second conductivity type into the shielding region such that $N_{sh}/N_{dev}$ is in a range of 1.5 to 100, where $N_{sh}$ is the net doping concentration of the shielding region and $N_{dev}$ is the net doping concentration of the current-conduction region.

Example 18. The method of any of examples 12 through 17, wherein forming the shielding region comprises: implanting dopants of the second conductivity type into the shielding region such that the net doping concentration ($N_{sh}$) of the shielding region is greater than $N_{crit}$ and $N_{crit}=E_{crit}\cdot\varepsilon_0\varepsilon_r/(e\cdot L)$, where $E_{crit}$ is a critical electrical field for avalanche breakdown of the SiC substrate, $\varepsilon_0$ is vacuum permittivity, εr is a dielectric constant and e is electron charge.

Example 19. The method of any of examples 12 through 18, wherein forming the shielding region comprises: growing a plurality of epitaxial layers of the first conductivity type; and masked implanting of dopants of the second conductivity type into each of the epitaxial layers in a laterally aligned manner.

Example 20. The method of any of examples 12 through 18, wherein forming the shielding region comprises: growing a plurality of epitaxial layers; implanting dopants of one conductivity type into the epitaxial layers; and implanting of dopants of the opposite conductivity type into the epitaxial layers.

Example 21. The method of any of examples 12 through 18, wherein forming the shielding region comprises: growing a single epitaxial layer of the first conductivity type; and implanting dopants of the second conductivity type at energies having multiple peaks or at a continuous energy spectrum.

Terms such as "first", "second", and the like, are used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
a SiC substrate;
a device structure in or on the SiC substrate and subject to an electric field during operation of the semiconductor device;
a current-conduction region of a first conductivity type in the SiC substrate below and adjoining the device structure; and
a shielding region of a second conductivity type laterally adjacent to the current-conduction region and configured to at least partly shield the device structure from the electric field,
wherein the shielding region has a higher net doping concentration than the current-conduction region,
wherein the shielding region has a length (L) measured from a first position which corresponds to a bottom of the device structure to a second position which corresponds to a bottom of the shielding region,
wherein the current-conduction region has a width (d) measured between opposing lateral sides of the current-conduction region,
wherein L/d is in a range of 1 to 10.

2. The semiconductor device of claim 1, wherein L/d is 5 or less.

3. The semiconductor device of claim 1, wherein $N_{sh}/N_{dev}$ is in a range of 1.5 to 100, where $N_{sh}$ is the net doping concentration of the shielding region and $N_{dev}$ is the net doping concentration of the current-conduction region.

4. The semiconductor device of claim 3, wherein $N_{sh}/N_{dev}$ is in a range of 3 to 30.

5. The semiconductor device of claim 1, wherein the net doping concentration ($N_{sh}$) of the shielding region is greater than $N_{crit}$, where $N_{crit}=E_{crit} \cdot \varepsilon_0 \varepsilon_r/(e \cdot L)$, $E_{crit}$ is a critical electrical field for avalanche breakdown of the SiC substrate, $\varepsilon_0$ is vacuum permittivity, $\varepsilon_r$ is a dielectric constant and e is electron charge.

6. The semiconductor device of claim 5, wherein $N_{sh}/N_{crit}$ is in a range of 1.5 to 100.

7. The semiconductor device of claim 1, wherein the device structure comprises a planar transistor gate structure comprising a gate dielectric on a first main surface of the SiC substrate and a gate electrode separated from the first main surface by the gate dielectric, wherein the current-conduction region adjoins a bottom of the gate dielectric at an interface between the first main surface of the SiC substrate and the gate dielectric, and wherein the first position from which the length of the shielding region is measured corresponds to the bottom of the gate dielectric.

8. The semiconductor device of claim 1, wherein the device structure comprises a trench transistor gate structure comprising a gate trench in the SiC substrate, a gate dielectric lining sidewalls and a bottom of the gate trench, and a gate electrode separated from the SiC substrate by the gate dielectric, wherein the current-conduction region adjoins the bottom of the gate trench, and wherein the first position from which the length of the shielding region is measured corresponds to the bottom of the gate trench.

9. The semiconductor device of claim 8, further comprising a transistor channel region at both sidewalls of the gate trench.

10. The semiconductor device of claim 1, wherein the device structure comprises a metal contact on a first main surface of the SiC substrate, wherein the current-conduction region adjoins the metal contact to form a Schottky junction, and wherein the first position from which the length of the shielding region is measured corresponds to the Schottky junction.

11. The semiconductor device of claim 1, further comprising a superjunction structure that comprises a first region of the first conductivity type below and adjoining the current-conduction region, and a second region of the second conductivity type below and adjoining the shielding region, wherein Na is a doping concentration of the first region and Wa is a width of the first region, wherein Nb is a doping concentration of the second region and Wb is a width of the second region, wherein $Na*Wa=\Delta*Nb*Wb$ in a horizontal cross-section of the superjunction structure, and wherein $\Delta$ is in a range of 2/3 to 3/2.

12. A method of producing a semiconductor device, the method comprising:
forming a device structure in or on the SiC substrate, the device structure subject to an electric field during operation of the semiconductor device;
forming a current-conduction region of a first conductivity type in the SiC substrate below and adjoining the device structure; and
forming a shielding region of a second conductivity type laterally adjacent to the current-conduction region, the shielding region configured to at least partly shield the device structure from the electric field,
wherein the current-conduction region and the shielding region are formed such that:
the shielding region has a higher net doping concentration than the current-conduction region;
the shielding region has a length (L) measured from a first position which corresponds to a bottom of the device structure to a second position which corresponds to a bottom of the shielding region;
the current-conduction region has a width (d) measured between opposing lateral sides of the current-conduction region; and
L/d is in a range of 1 to 10.

13. The method of claim 12, wherein forming the device structure comprises:
forming a gate dielectric on a first main surface of the SiC substrate; and
forming a gate electrode on the gate dielectric,
wherein the current-conduction region adjoins a bottom of the gate dielectric at an interface between the first main surface of the SiC substrate and the gate dielectric,
wherein the first position from which the length of the shielding region is measured corresponds to the bottom of the gate dielectric.

14. The method of claim 12, wherein forming the device structure comprises:
etching a gate trench in the SiC substrate;
lining sidewalls and a bottom of the gate trench with a gate dielectric; and
forming a gate electrode in the gate trench and separated from the SiC substrate by the gate dielectric,
wherein the current-conduction region adjoins the bottom of the gate trench,
wherein the first position from which the length of the shielding region is measured corresponds to the bottom of the gate trench.

15. The method of claim 12, wherein forming the device structure comprises:
forming a metal contact on a first main surface of the SiC substrate, wherein the current-conduction region adjoins the metal contact to form a Schottky junction, wherein the first position from which the length of the shielding region is measured corresponds to the Schottky junction.

16. The method of claim 12, further comprising:

forming a superjunction structure that comprises a first region of the first conductivity type below and adjoining the current-conduction region, and a second region of the second conductivity type below and adjoining the shielding region, wherein Na is a doping concentration of the first region and Wa is a width of the first region, wherein Nb is a doping concentration of the second region and Wb is a width of the second region, wherein Na*Wa=Δ*Nb*Wb in a horizontal cross-section of the superjunction structure, and wherein Δ is in a range of 2/3 to 3/2.

17. The method of claim 12, wherein forming the shielding region comprises:

implanting dopants of the second conductivity type into the shielding region such that $N_{sh}/N_{dev}$ is in a range of 1.5 to 100, where $N_{sh}$ is the net doping concentration of the shielding region and $N_{dev}$ is the net doping concentration of the current-conduction region.

18. The method of claim 12, wherein forming the shielding region comprises:

implanting dopants of the second conductivity type into the shielding region such that the net doping concentration ($N_{sh}$) of the shielding region is greater than $N_{crit}$ and $N_{crit}=E_{crit} \cdot \varepsilon_0 \varepsilon_r/(e \cdot L)$, where $E_{crit}$ is a critical electrical field for avalanche breakdown of the SiC substrate, $\varepsilon_0$ is vacuum permittivity, εr is a dielectric constant and e is electron charge.

19. The method of claim 12, wherein forming the shielding region comprises:

growing a plurality of epitaxial layers of the first conductivity type; and masked implanting of dopants of the second conductivity type into each of the epitaxial layers in a laterally aligned manner.

20. The method of claim 12, wherein forming the shielding region comprises:

growing a plurality of epitaxial layers;

implanting dopants of one conductivity type into the epitaxial layers; and implanting of dopants of the opposite conductivity type into the epitaxial layers.

21. The method of claim 12, wherein forming the shielding region comprises:

growing a single epitaxial layer of the first conductivity type; and implanting dopants of the second conductivity type at energies having multiple peaks or at a continuous energy spectrum.

* * * * *